US007425820B2

(12) United States Patent
Masri et al.

(10) Patent No.: US 7,425,820 B2
(45) Date of Patent: Sep. 16, 2008

(54) HIGH CURRENT MEASUREMENT WITH TEMPERATURE COMPENSATION

(75) Inventors: Farid E. Masri, Dublin, OH (US); Christopher S. Sherman, Dublin, OH (US)

(73) Assignee: Dynamp LLC, Grove City, OH (US)

( * ) Notice: Subject to any disclaimer, the term of this patent is extended or adjusted under 35 U.S.C. 154(b) by 188 days.

(21) Appl. No.: 11/387,517

(22) Filed: Mar. 23, 2006

(65) Prior Publication Data
US 2007/0223002 A1 Sep. 27, 2007

(51) Int. Cl.
*G01B 9/02* (2006.01)
(52) U.S. Cl. .......................................... 324/96; 324/750
(58) Field of Classification Search .................. 324/96, 324/105
See application file for complete search history.

(56) References Cited
U.S. PATENT DOCUMENTS 4,797,607 A * 1/1989 Dupraz ......................... 324/96
5,696,858 A * 12/1997 Blake ........................... 385/12
5,721,615 A * 2/1998 McBride et al. ............. 356/477

* cited by examiner

*Primary Examiner*—Vinh P Nguyen
(74) *Attorney, Agent, or Firm*—Jason H. Foster; Kremblas, Foster, Phillips & Pollick

(57) ABSTRACT

A non-contact device for measuring current in a conductor. The device includes an interferometer with an optical fiber that extends around the conductor and through which light beams pass. The magnetic field around the conductor, caused by the current conducted through the conductor, causes a phase shift in the light beams, which is measured. The measured current is corrected as a function of the temperature of at least the fiber, and possibly also the temperature of the quarter wave plate and/or the compensation coil in the interferometer. Multiple sensors are evenly spaced and mounted to the fiber in the preferred embodiment, and the signals from the sensors are averaged. The average signal is used to correct the measured current.

12 Claims, 5 Drawing Sheets

Implementation of the Temperature Compensation in the Closed Loop Current Sensor

Temperature compensation effect on closed loop current sensor

| Fiber Temp | Box Temp | SF error without compensation | SF error with compensation |
|---|---|---|---|
| -40 | -40 | -0.04% | 0.03% |
| -20 | -40 | -0.19% | 0.02% |
| -20 | -20 | -0.12% | -0.06% |
| 0 | -20 | -0.23% | -0.03% |
| 0 | 0 | -0.09% | -0.05% |
| 25 | 0 | -0.18% | 0.06% |
| 25 | 25 | 0.03% | 0.03% |
| 50 | 25 | -0.19% | 0.01% |
| 50 | 50 | -0.05% | -0.07% |

Compensation used is:

70 ppm/deg C temp difference
+
linear fit to the box temp of 10 ppm/deg C

FIG. 5

HIGH CURRENT MEASUREMENT WITH TEMPERATURE COMPENSATION

BACKGROUND OF THE INVENTION

1. Field of the Invention

This invention relates generally to a high current (up to about 500 KA) measurement device, and more particularly to a device for measuring high current with substantial accuracy that is not significantly affected by temperature variations in the sensing equipment.

2. Description of the Related Art

Conventional high current measurement equipment uses Hall effect technology to measure the magnetic field around a conductor. Electricity carried through a conductor produces a magnetic field that varies with current, and conventional measurement equipment uses an electronic sensor (Hall sensor) that varies its output voltage in response to changes in magnetic field density. A Hall sensor in close proximity to the conductor can thus be used to effectively measure the current without interrupting the circuit or making electrical contact with the conductor. Typically, the Hall sensor is integrated with a wound core that surrounds the conductor to be measured. Conventional Hall technology current measuring equipment has the disadvantages of being expensive, large, heavy and time-consuming to install.

Optical devices can also be used to measure current. Such devices are interferometers that utilize the Faraday effect, in which there is an interaction between light and the magnetic field produced around the conductor, to measure current. Existing technology for carrying out this measurement does not have sufficient accuracy under all circumstances. The reason for this is explained below.

An optical interferometer of the type described works on the principle that the speeds of right handed circularly polarized (RHCP) and left handed circularly polarized (LHCP) light waves are oppositely affected by a magnetic field. A fiber optic circuit is arranged in such a way that two beams, one that is RHCP and one that is LHCP, are sent through the magnetic field around the conductor, and the total phase difference accumulated between the two beams is measured. The total phase difference is proportional to the line integral of the magnetic field along the path of the sensing fiber. Thus, by extending the optical fiber around the current carrying conductor an integral number of times, the sensor measures the closed path integral of the magnetic field around the conductor. By Ampere's Law, this is equal to the current carried in the conductor.

The principle of reciprocity ensures that common mode effects are cancelled, and thus path non-idealities cannot create a phase difference between the two beams. However, the influence of the magnetic field through the Faraday Effect is non-reciprocal. This is because the sensing path is terminated in a mirror, at which a RHCP beam is converted to a LHCP beam upon reflection, and vice versa. Thus, the outbound RHCP light beam returns from the mirror as a LHCP beam, and vice versa. Both beams travel through the sensing path as both RHCP and LHCP beams, only in opposite directions. As the sense of circular polarization is reversed upon reflection at the mirror, so also is the direction of propagation relative to the magnetic field. Thus, when compared to a unidirectional sensor configuration, the "round trip" configuration provides that reciprocal non-idealities are cancelled and the magnetic field effect is doubled.

The phase shift caused by the magnetic field is a function of the current flowing in the conductor, and there are two main properties that affect how much phase shift is measured for a given current, also called the "scaling" of the current sensor. The first of these is the quality of the quarter wave plate. The quarter wave plate defines the beginning of the sensing region, where the beams are polarized, and the end of the sensing region for the returning light. An imperfect quarter wave plate gives rise to impure beams, and consequently a change in the scaling of the sensor.

The second property that affects the scaling of the sensor is the magnetic sensitivity of the sensing fiber itself. The sensitivity of the fiber to the effects of a magnetic field is described by the Verdet constant of the fiber.

The properties described above that affect the scaling of the sensor (the quarter wave plate quality and the Verdet constant of the fiber) are functions of temperature. Current sensors are used for the measurement of large DC currents, and the conductors that carry these currents are large and generate significant heat. Because of this, there can be large temperature gradients around the conductor, which reduces the ability of the current sensor to maintain an accurate scale factor.

It is currently known to measure the temperature of the optical modulator of an optical current sensor, and correct any error in the current sensor output caused by an increase in temperature. However, this conventional method does not have an appreciable effect on errors in current measurement.

Therefore, the need exists for an apparatus and method for reducing errors introduced in current sensors due to temperature variations in the components of the optical current sensing device.

BRIEF SUMMARY OF THE INVENTION

In a basic embodiment of the present invention, there is a fiber optic current sensor which measures the phase shift between reciprocal circular polarization paths around a current carrying conductor. There are at least two temperature sensors, one of which is near the quarter wave plate to measure its temperature, and the other of which measures (or estimates) the temperature of the optical fiber loop. It is preferred that the second sensor be several individual sensors with outputs that are averaged together to provide a single, average fiber temperature datum at any particular point in time. The invention also includes means for correcting the current sensor output in response to the two temperature sensors. This preferably includes a computer that incorporates the average temperature and quarter wave plate temperatures and, using an algorithm, produces a current sensor output that compensates for the temperatures measured.

Another embodiment of the invention includes a basic fiber optic current sensor which measures the phase shift between reciprocal circular polarization paths around a current carrying conductor. A plurality of temperature sensors is mounted around the optical fiber extending around the conductor. It is preferred that the fibers are evenly spaced around the fiber, but it is contemplated that the sensors may be uneven, for example to concentrate sensors where there are high temperature gradients. Each of the sensors produces an output signal that is a function of the temperature of the fiber at the sensed location. A thermal sensor is also mounted to a compensation coil. A computer receives the temperature information from the fiber sensors, averages these signals, receives the compensation coil sensor and then calculates the compensation factor necessary to correct the displayed or recorded current measurement due to the effect that the temperature of the fiber and the compensation coil have on the measurement of the current. Alternatively, the computer can use a mathematical algorithm to calculate an "effective average", an approximate average, median, mode or some other statistically significant value to have a similar effect.

The resulting current measurement is accurate to 0.1 percent, whereas existing optical current sensors are accurate to 0.2 percent at best. When currents in the range of 500 K-Amps are being read, small errors can result in inaccurate process control, energy consumption, raw material usage, and related data upon which management decisions are based.

BRIEF DESCRIPTION OF THE SEVERAL VIEWS OF THE DRAWINGS

FIG. 5 is a table showing a comparison of the test results using an embodiment of the invention and another device.

Figure 1:
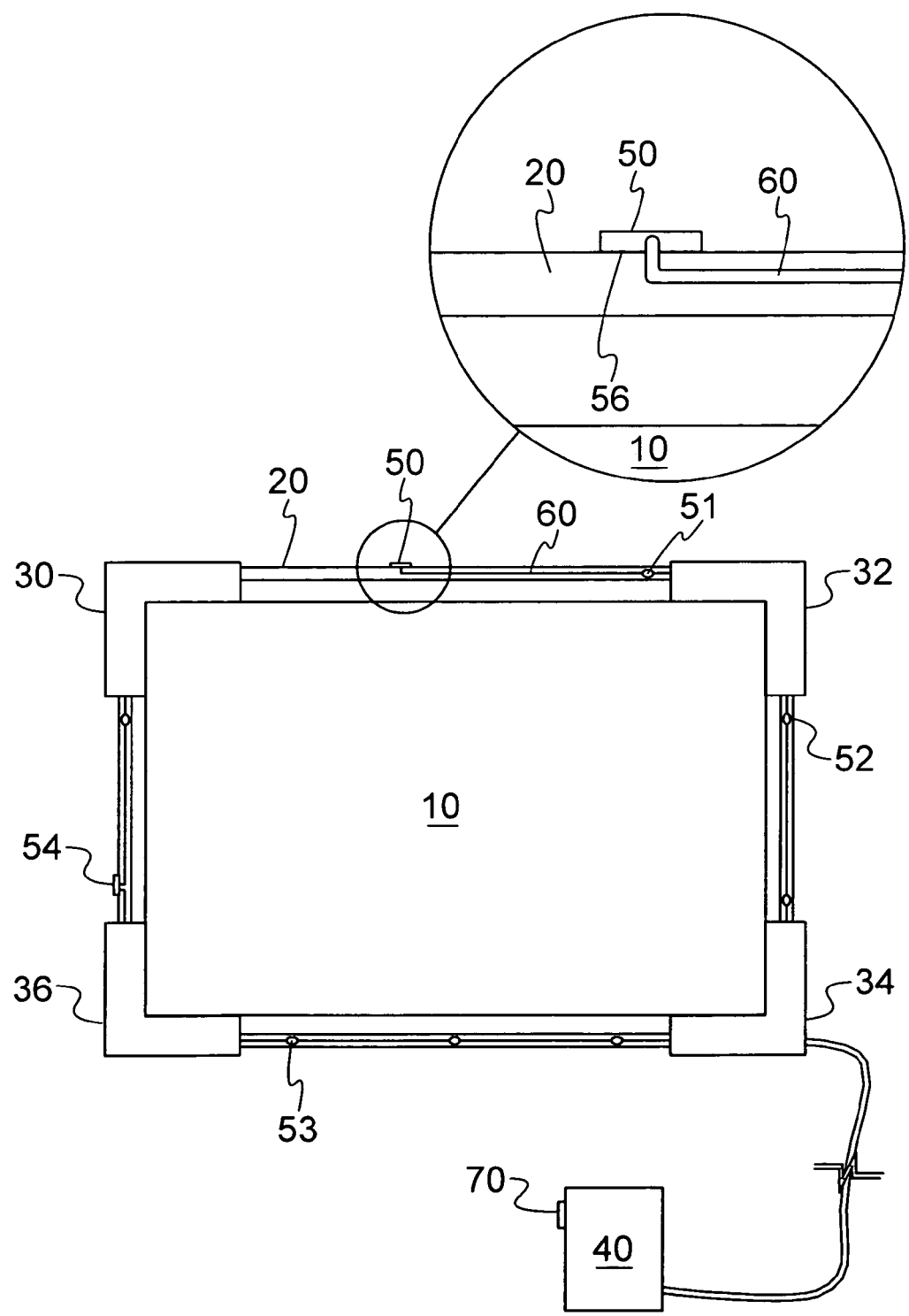
FIG. 1 is a schematic view of an embodiment of the present invention on a current carrying bus.

In describing the preferred embodiment of the invention which is illustrated in the drawings, specific terminology will be resorted to for the sake of clarity. However, it is not intended that the invention be limited to the specific term so selected and it is to be understood that each specific term includes all technical equivalents which operate in a similar manner to accomplish a similar purpose. For example, the word connected or term similar thereto are often used. They are not limited to direct connection, but include connection through other circuit or structural elements where such connection is recognized as being equivalent by those skilled in the art.

DETAILED DESCRIPTION OF THE INVENTION

An embodiment of the present invention is shown in FIG. 1. A current carrying conductor, such as the bus 10, has an optical fiber 20 extending around its peripheral surface. The supports 30, 32, 34 and 36 are non-conductive and low magnetic permeability bodies that seat against the outer surface of the bus 10 and have characteristics that make them suitable for disposing the fiber 20 a fixed distance from the bus 10. In one embodiment, the supports 30-36 are polyvinyl chloride (PVC) blocks with a groove on their outwardly facing surface in which the fiber 20 can be seated.

The fiber 20 is wrapped in one or more loops around the bus 10 and extends to a device 40 that is described below. A plurality of thermal sensors, such as the thermal sensors 50, 51, 52, 53 and 54, are mounted on the exterior of the fiber 20. The thermal sensors 50-54 are conventional thermal sensors that produce an electrical output signal that is a function of the temperature of the object the sensor is designed to sense. One sensor that can be used for the thermal sensors 50-54 is sold by Dallas-Maxim under the model/series number DS1820. Of course, other sensors can be substituted for this sensor, with corresponding advantages and disadvantages that will be understood by persons of ordinary skill, including, but not limited to, the DS1820, DS 1822 and MAX6575L/H. It is also possible to use digital sensors, such as serial or SPI sensors, pulse width modulated (PWM) sensors, two and three wire bus sensors and analog signals.

In the embodiment shown in FIG. 1, the sensors 50-54 are mounted to the fiber 20 by adhering to the outer surface thereof. A thin film of thermally conductive adhesive 56 is disposed between the sensor 50 and the fiber 20. Of course, sensors could be mounted to a fiber using any suitable means, including but not limited to tape, wire ties, clamps or any other structure that will suitably mount a sensor to a fiber for detecting the fiber's temperature. Still further, non-contact sensors could be used to detect the temperature of the fiber, including optical sensors. Because temperature increases of the fiber 20 are generated externally to the fiber 20, the temperature of the air or other fluid surrounding the fiber 20 can, alternatively, be measured to obtain an accurate measurement of the temperature of the fiber 20. Thus, the term "detecting a temperature of the fiber" includes using sensors mounted on the fiber, near the fiber and sensors measuring or even estimating the temperature of the air or other fluid around the fiber. It will become apparent to a person of ordinary skill from the description herein that other sensors and means for mounting the sensors could be substituted for those shown in FIG. 1. In an embodiment that is contemplated, but not illustrated, hollow tubes can extend between the supports 30-36 to encase the fiber 20 entirely to prevent contamination and to minimize convection and/or radiant heating of the fiber 20.

Although there are nine sensors shown in FIG. 1, the invention contemplates a different number of sensors mounted at one or multiple positions along the fiber. For example, it is preferred to have sensors essentially evenly spaced along the fiber 20 around the conductor so that temperature variations around the fiber 20 do not contribute to any error. By evenly spacing the sensors, the sensors will detect the temperature at any "hot spots", "cold spots" and any intermediate temperatures in between. In order to detect a reasonable number of temperatures around the fiber, it is preferred to have at least four operating sensors at evenly spaced positions around the fiber. The preferred embodiment of the invention does not need to be capable of determining which sensor each temperature signal is coming from, because the sensor output signals are simply averaged, even though this capability may be advantageous for diagnostics and alarm purposes. However, it is not a necessary feature of the invention. Thus, if there are more than four sensor installed, it is not harmful if fewer than all sensors provide signals. It is only preferred to have four signals to obtain a preferred level of correction due to temperature of the fiber. In a particularly desirable configuration, there is at least one sensor above, one below, and one on each side of the rectangular bus 10 shown in FIG. 1.

It should be noted that the discussion above does not mean that three sensors will fail to provide useful information, and a three sensor apparatus is within the scope of the invention despite the fact that it will provide less than optimal information. Still further, one or two sensors are within the scope of the invention, despite the fact that they provide still less information than three sensors.

There is no absolute maximum number of sensors that can be used to measure temperature. It should be noted, however, that as the number of sensors increases above about eight, the cost of the additional sensors and the computational power for receiving, sampling and using the signals from the sensors provides diminishing returns in improved accuracy. Thus, one maximum number of sensors for most feasible embodiments is contemplated to be twelve. Additionally, a larger number of sensors, such as six, could be used so that if one or two sensors are damaged there are always at least four that operate properly. Likewise, the signals from a larger number of sensors can be received by a computer and the most disparate signals used for processing, in order to further enhance accuracy.

The wire 60, which is preferably a bundle of pairs of very fine conductors surrounded by insulation wherein each pair of conductors connects electrically to one of the sensors, extends along the fiber 20. The wire 60 is either encased in the sheathing of the fiber 20 or mounts to the exterior thereof, such as by tape, wire ties, adhesive or other fastening means. The wire 60 extends with the fiber 20 to the device 40 so that the signals generated by the sensors and communicated through the pairs of conductors can be utilized by the device 40. Of course, the wire 60 can be replaced by any suitable alternative means for communicating information, including, but not limited to, analog, digital, optical or wireless transceivers. Furthermore, in a preferred embodiment, the wire 60 has enough slack to permit flexing of the fiber 20 without straining the wire 60 and its connections to the sensors 50-54. It is contemplated that the wire 60 is physically flexible in order to permit it to be bent, preferably by hand.

The device 40, which can be contained within a case or a control room spaced from the bus 10, and includes a conventional interferometer (of the in-line, Sagnac or any other type) and conventional mechanisms that enable measurement of the phase shift caused by the current in the bus 10 in a conventional manner. The device 40, which contains an "open loop current sensor", is capable of measuring the current in the bus 10 by measuring only the phase shift between the two light beams in the fiber 20, rather than by generating an equal and opposite magnetic field (as with "closed loop current sensor", described below). The measurement may comprise electronic closed loops including electro-optic means of canceling the magnetic field induced phase shift, or it may include other means known to the person having ordinary skill. Nonetheless, the inventive features of the device 40 are the inclusion, with a conventional open loop current sensor, of other devices that compensate for temperature variations, which devices will now be explained.

The device 40 includes means for receiving the output signals from the sensors 50-54. This can be a computer with a specialized card that operates as an analog to digital converter for receiving analog signals from the sensors and assigning digital (discrete numerical) values to the signals. The computer can be the multi-purpose computer already used in the conventional interferometer, or a different computer, such as a single purpose computer (e.g., logic circuit) or any other apparatus that can receive such an output. It is preferred that the signals produced by the sensors be digital to reduce the number of conductors required, and any interference or data corruption. It is contemplated that the device 40 include means for checking the validity of each signal transmitted, such as by using a cyclic redundancy check or some other well-known procedure. If a sensor appears to be sending corrupted temperature data, it can be excluded from the calculation of the average temperature of the sensors.

The device 40 also includes means for calculating the average of the values of all signals received. This is preferably a computer that can use a conventional algorithm to calculate the average of the digital values of the signals. Furthermore, the device 40 contains a thermal sensor 70 that senses the temperature of the quarter wave plate, such as by measuring the temperature of the air in the enclosure in which the quarter wave plate is housed or by a sensor mounted to the quarter wave plate. The signal from the sensor 70 is communicated electronically to the means for receiving the signals from sensors.

Thus, in a preferred embodiment, the device 40 receives the temperature sensors' signals and converts them to discrete values that are a function of the temperature sensed at their local position on the fiber 20. The device 40 also receives the temperature sensor signal from the quarter wave plate's thermal sensor 70. The computer then calculates an average temperature for the fiber 20, and compares the average fiber temperature and the temperature of the quarter wave plate to their starting temperatures. If there is a temperature difference in either or both, the computer creates an appropriate compensation factor that will be used to correct electronically the current measured using the conventional interferometer.

The output from the current sensor is modified to compensate for the temperature of the fiber and possibly other components of the current sensor that have a measured temperature. This is accomplished by modifying the output signal of the current sensor by a number that is a function of a temperature difference. For example, when only the temperature of the fiber is being measured, the temperature difference that modifies the current sensor output is the difference between the fiber's instantaneously sensed temperature and the temperature that gives the fiber a particular Verdet constant that is assumed in conventional current sensors. The fiber's instantaneous temperature in this calculation is the average temperature at an instant in time sensed by the sensors on the fiber, as discussed above. Alternatively, if there are two components that have sensed temperatures (e.g., the fiber and a compensation coil), the difference in temperature is the difference in temperature of the two measured components.

Figure 3:
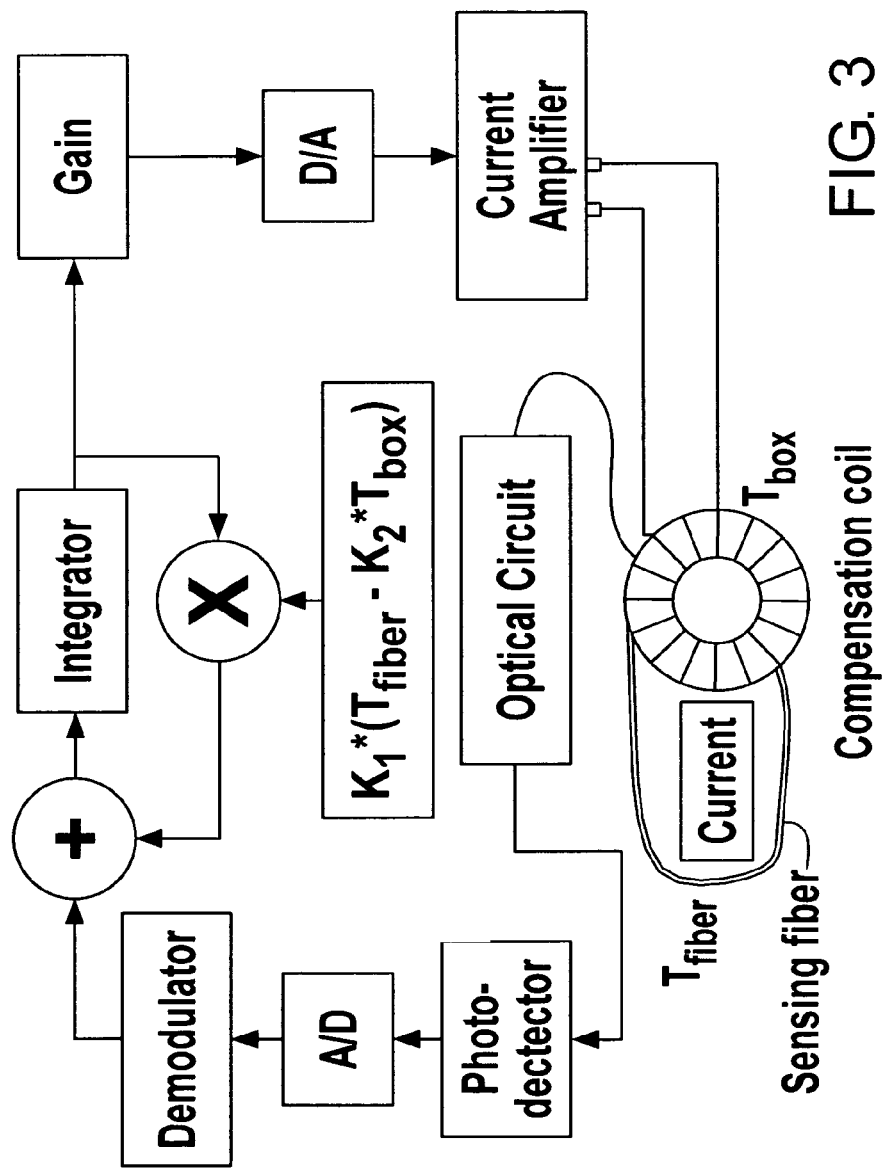
FIG. 3 is a schematic diagram showing an embodiment of the closed loop sensor.
Figure 4:
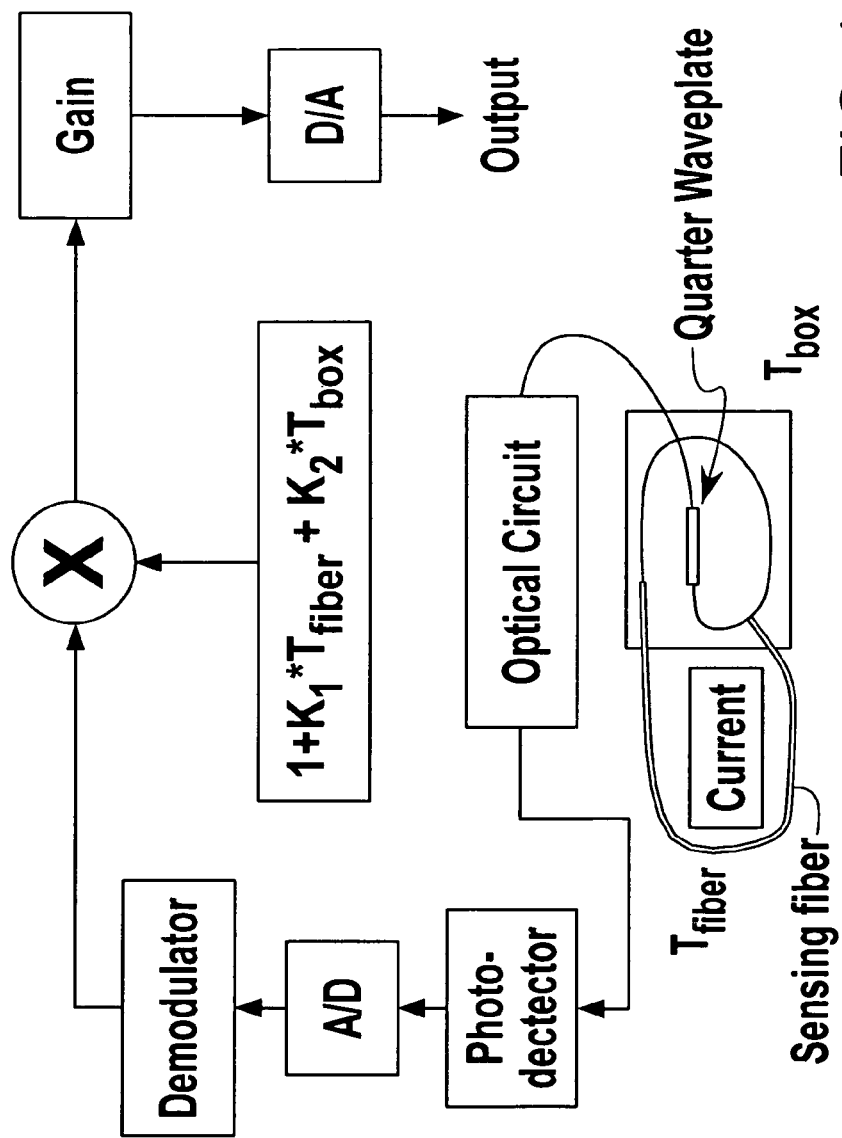
FIG. 4 is a schematic diagram showing an embodiment of the open loop sensor.

The difference in temperature is multiplied by a constant (K) and the product is then added to the signal from the current sensor's output to result in a sensor output that is corrected for the temperature of one or more components. If the temperature of the fiber is not different from the temperature that results in the assumed Verdet constant, the temperature difference is zero, which is multiplied by the constant, K, and the current sensor's output remains unchanged when the product is added to the current sensor's output. However, if there is a temperature difference, that difference will be multiplied by the constant, and the output of the current sensor will be modified by adding that product to it. FIGS. 3 and 4 show current sensors with correction factors that are a function of the temperatures of one or more components. The constants, $K_1$ and $K_2$, can be equal to 1.0 in one embodiment and they can vary as a function of temperature. Of course, other values for the constants are possible. Additionally, the variables $T_{fiber}$ and $T_{box}$ are, respectively, the temperature of the fiber and the temperature of the box that contains the compensation coil (in FIG. 3 embodiment) or the quarter wave plate (FIG. 4 embodiment).

The process carried out by the preferred apparatus described above includes at least one and preferably two temperature measurements (at least one of the fiber and one of the quarter wave plate) and electronic compensation is the measured current output for changes in the quarter wave plate quality and the Verdet constant of the fiber as a result of a temperature change (from a starting temperature). This compensation is preferably carried out by the computer, which incorporates a correction factor into the displayed or recorded current sensor output.

In an alternative embodiment of the invention in which the quarter wave plate tolerances are consistently good enough to avoid the need for temperature correction of errors introduced thereby, there is no temperature sensor measuring the temperature of the wave plate. Thus, this alternative embodiment includes a basic fiber optic current sensor which measures the phase shift between reciprocal circular polarization paths around a current carrying conductor, and includes a quarter wave plate that does not exhibit a significant temperature sensitivity. This quarter wave plate's temperature need not be measured, due to the fact that such a quarter wave plate does not introduce appreciable error. Therefore, the only temperature correction apparatus in this structure is a distributed temperature sensor for measuring or estimating the average temperature around the sensing loop, and means for correcting the sensor output as a function of the temperature measurement.

When the improved current measuring apparatus is started, each sensor on the device can be electronically polled by the computer to determine that it is functioning properly. Still further, the operator of the apparatus could view a display, such as a computer monitor or single purpose numerical display, that displays to the operator how many of the sensors are functioning. It is contemplated that the operator will be given a warning if fewer than six sensors are functioning, and an alarm will sound and the operator will be notified of a serious problem if fewer than four sensors are functional. During operation, the computer also periodically polls the sensors to obtain their temperature measurements and to continue monitoring that they are functional.

It is contemplated that the computer can display the actual temperature of each sensor for technicians, but the operator typically will not see the temperatures displayed. The operator only sees the average temperature, if anything other than a warning or a proper operation indicator.

In the open loop current sensor (described above), the phase shift between the two beams is measured. In an alternative mechanism for measuring current in a conductor, which is referred to herein as a "closed loop current sensor", a magnetic field generator device is included as part of the optical fiber loop, and this device creates a nulling magnetic field. The current sensor output is then a signal derived from the magnetic field generating device, because the equal and opposite magnetic field in the device is a function of the current in the current carrying conductor (bus) as defined below.

An advantage of the closed loop current sensor is that it removes the sensitivity of the quarter wave plate to temperature, because the compensation coil and the sensing fiber respond equally and oppositely to imperfections in the quarter wave plate. Because one substantially cancels the other, the net effect is that the closed loop current sensor is insensitive to the temperature of the quarter wave plate. However, the phase shift accumulated in the compensation coil depends on its temperature. Additionally, the phase shift accumulated in the fiber 120 depends on the temperature in the fiber 120 as with the FIG. 1 embodiment described above. If these temperatures are different, the scale factor will change. Thus, in the closed loop current sensor, the invention accounts for the temperatures of the fiber and the compensation coil, although in a less preferred, but still viable embodiment, only the temperature of the fiber is measured.

Figure 2:
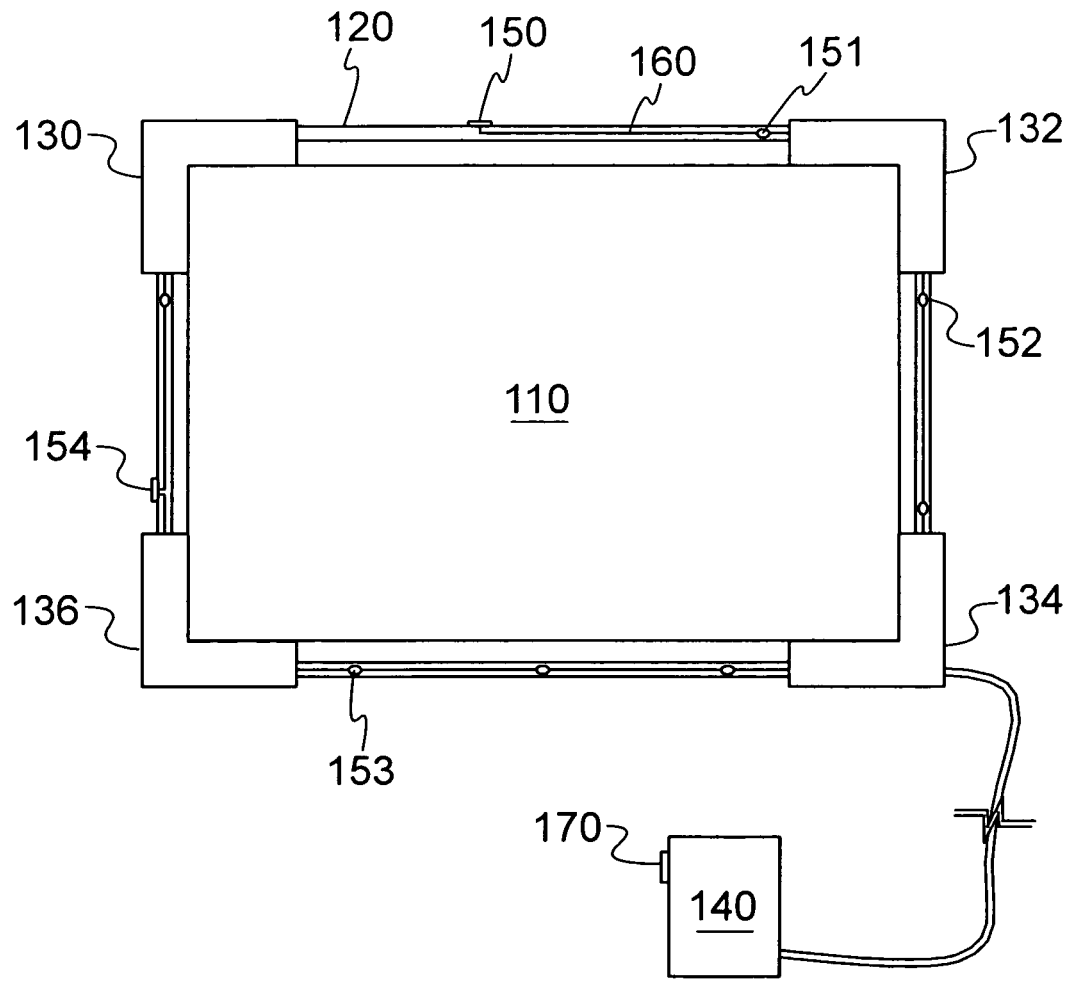
FIG. 2 is a schematic view of another embodiment of the present invention.

An embodiment of the present invention utilizing a closed loop current sensor is shown in FIG. 2, which is substantially identical to the embodiment of FIG. 1 in many respects. The current carrying conductor, such as the bus 110, has an optical fiber 120 extending around its peripheral surface. The supports 130, 132, 134 and 136 are non-conductive and preferably low magnetic permeability bodies that seat against the outer surface of the bus 110 and have characteristics that make them suitable for disposing the fiber 120 a fixed distance from the bus 110.

The fiber 120 is wrapped once around the bus 110, or as many times as is suitable, and extends to a device 140 that is described below. A plurality of thermal sensors, such as the thermal sensors 150, 151, 152, 153 and 154, are mounted on the exterior of the fiber 120, but could be mounted near the fiber 120 as described above in relation to the sensors detecting the temperature of the fiber 20. The thermal sensors 150-154 are conventional thermal sensors that produce an electrical signal that is a function of the temperature of the object the sensor is designed to sense.

In the embodiment shown in FIG. 2, the sensors 150-154 are mounted to the fiber 120 in a manner similar to those shown in FIG. 1. The number of sensors, and the manner of attachment of the sensors, in the FIG. 2 embodiment are similarly variable to those of the FIG. 1 embodiment.

The wire 160 is similar to the wire 60 of FIG. 1, and is similarly replaceable by other communication means. The wire 160 extends with the fiber 120 to the device 140 so that the signals conducted from the sensors by the pairs of conductors can be utilized by the device 140.

The device 140 includes a conventional interferometer apparatus that measures the current in the bus 110 in a conventional manner. This can be an in-line or a Sagnac interferometer, as will be understood. In addition to the interferometer apparatus, the device 140 includes means for receiving the signals from the sensors 150-154. This can be a computer with a specialized card, or any suitable means including the computer already used in the conventional interferometer. Additionally, the device 140 includes means for calculating the average of the values of all signals received. This can be the same computer, which can implement a conventional algorithm to calculate the average of the digital values of the signals.

The device 140 also includes means for creating a magnetic field based closed loop sensor, such as a fiber optic compensation coil that closes the loop, and in which N wire turns are wound around M fiber turns in a toroidal coil creating the compensation coil described above. In the compensation coil, a current of I/NM fed back through the compensation coil creates an equal and opposite optical phase shift to that created by the main current I in the bus. The feed back current through the compensation coil is preferably the current sensor output.

The device 140 contains a thermal sensor 170 that senses the temperature of the compensation coil. This can be accomplished, for example, by sensing the air around the compensation coil or the surface temperature. The output signal from the sensor 170 is communicated electronically to the means for receiving the signals from sensors. Thus, in a preferred embodiment, the device 140 receives the temperature sensors' output signals and converts them to discrete values that are a function of the temperature sensed at their position on the fiber 120. The device 140 also receives the temperature sensor's output signal from the compensation coil. The computer then calculates an average temperature for the fiber 120, and compares the average fiber temperature and the temperature of the compensation coil to the starting temperatures for each. If there is a significant difference in either or both, the computer then creates an appropriate compensation factor to correct electronically the measured current output using the conventional interferometer.

The process carried out by the apparatus described above includes taking at least two temperature measurements (at least one of the fiber and one of the compensation coil) and electronic correction of the measured current output for changes in the compensation coil and the Verdet constant of the fiber as a result of a temperature change (from a starting temperature). This correction is preferably carried out by the computer.

Thus, for the closed loop current sensor, the invention includes the basic fiber optic current sensor which measures the phase shift between reciprocal circular polarization paths around a current carrying conductor. The invention also includes a compensator having N wire turns and M fiber turns with a feedback current for nulling (or approximately nulling) the total optical phase shift, and temperature sensors, preferably one for measuring the temperature of the compensator and the other for measuring the average of the distributed temperature along the sensing path. Finally, the invention includes means for correcting the sensor output in response to the aforementioned two measured temperatures.

While certain preferred embodiments of the present invention have been disclosed in detail, it is to be understood that various modifications may be adopted without departing from the spirit of the invention or scope of the following claims.

The invention claimed is:

1. An improved current measurement apparatus in which a light beam passes through a quarter wave plate of an interferometer into an optical fiber extending around a current carrying conductor for producing a measured current output, the improvement comprising:
    (a) at least one optical fiber thermal sensor detecting a temperature of the optical fiber and producing an output that is a function of the optical fiber's temperature; and
    (b) means for correcting the measured current output as a function of the optical fiber thermal sensor output.

2. The improved apparatus in accordance with claim 1, further comprising means for receiving said optical fiber thermal sensor output.

3. The improved apparatus in accordance with claim 1, further comprising:
    (a) at least one quarter wave plate thermal sensor detecting a temperature of the quarter wave plate and producing an output that is a function of the quarter wave plate's temperature;
    (b) means for receiving said quarter wave plate thermal sensor output; and
    (c) means for correcting the measured current output as a function of the quarter wave plate thermal sensor output.

4. The improved apparatus in accordance with claim 1, further comprising:
    (a) a compensation coil through which said at least one light beam passes;
    (b) at least one compensation coil thermal sensor detecting a temperature of the compensation coil and producing an output that is a function of the compensation coil's temperature;
    (c) means for receiving said compensation coil thermal sensor output; and
    (d) means for correcting the measured current output as a function of the compensation coil thermal sensor output.

5. The improved apparatus in accordance with claim 1, wherein said at least one optical fiber thermal sensor further comprises a plurality of optical fiber thermal sensors detecting a temperature of the optical fiber at different fiber locations, and each of said sensors producing an output that is a function of the optical fiber's temperature at its respective location.

6. The improved apparatus in accordance with claim 5, wherein each of said optical fiber thermal sensors is mounted to the optical fiber.

7. The improved sensor in accordance with claim 6, wherein said plurality of optical fiber thermal sensors comprises two sensors.

8. The improved sensor in accordance with claim 7, wherein said plurality of optical fiber thermal sensors comprises four sensors.

9. The improved sensor in accordance with claim 8, wherein said plurality of optical fiber thermal sensors comprises six sensors.

10. The improved sensor in accordance with claim 9, further comprising means for averaging the outputs of the optical fiber thermal sensors.

11. An improved current measurement apparatus in which a light beam passes through a quarter wave plate of an interferometer into an optical fiber extending around a current carrying conductor for producing a measured current output, the improvement comprising:
    (a) a plurality of optical fiber thermal sensors mounted to the optical fiber for detecting a local fiber temperature and producing an output signal that is a function of the fiber's local temperature;
    (b) a computer connected to said optical fiber thermal sensors for receiving said optical fiber thermal sensor output signals, computing an average of said output signals and correcting the measured current output as a function of the average of the output signals.

12. A method for correcting a measured current output of a current measurement apparatus in which a light beam passes through a quarter wave plate of an interferometer into an optical fiber extending around a current carrying conductor for producing the measured current output, the method comprising:
    (a) mounting a plurality of thermal sensors to the optical fiber;
    (b) detecting a local fiber temperature at each of said plurality of thermal sensors;
    (c) producing an output signal that is a function of the local fiber temperature;
    (d) computing an average of said thermal sensor output signals; and
    (e) correcting the measured current output as a function of the average of the thermal sensor output signals.

* * * * *